United States Patent [19]

Ersoz et al.

[11] Patent Number: 4,658,437
[45] Date of Patent: Apr. 14, 1987

[54] TUNING VOLTAGE TRACKING ARRANGEMENT

[75] Inventors: Nathaniel H. Ersoz; James Hettiger, both of Marion County, Ind.

[73] Assignee: RCA Corporation, Princeton, N.J.

[21] Appl. No.: 705,900

[22] Filed: Mar. 1, 1985

[51] Int. Cl.$^4$ .............................................. H04B 1/16
[52] U.S. Cl. .................................... 455/180; 455/195; 455/197; 455/191
[58] Field of Search ............... 455/180, 188, 191, 195, 455/197, 340

[56] References Cited

U.S. PATENT DOCUMENTS

| 3,866,138 | 2/1975 | Putzer . | |
|---|---|---|---|
| 3,889,210 | 6/1975 | Matsuura et al. . | |
| 4,002,986 | 1/1977 | Ma | 455/188 |
| 4,291,290 | 9/1981 | Ijichi et al. | 455/191 |
| 4,380,827 | 4/1983 | Moon . | |
| 4,404,686 | 9/1983 | Moon | 455/191 |
| 4,418,427 | 11/1983 | Muterspaugh . | |
| 4,418,428 | 11/1983 | Evans . | |
| 4,442,548 | 4/1984 | Lehmann | 455/197 |
| 4,476,583 | 10/1984 | Muterspaugh . | |

FOREIGN PATENT DOCUMENTS 1428720  3/1976  United Kingdom .

Primary Examiner—Jin F. Ng
Attorney, Agent, or Firm—Eugene M. Whitacre; Adel A. Ahmed; Peter M. Emanuel

[57] ABSTRACT

A superheterodyne receiver having a plurality of selectable bands includes a tuning voltage source and a band selection signal source. To improve tracking, the receiver includes a selectively enabled voltage modifying arrangement responsive to the band selection signal for providing a modified tuning voltage to one of the radio frequency and local oscillator tuning circuits when the tuning voltage is within a predetermined portion of its range.

6 Claims, 1 Drawing Figure

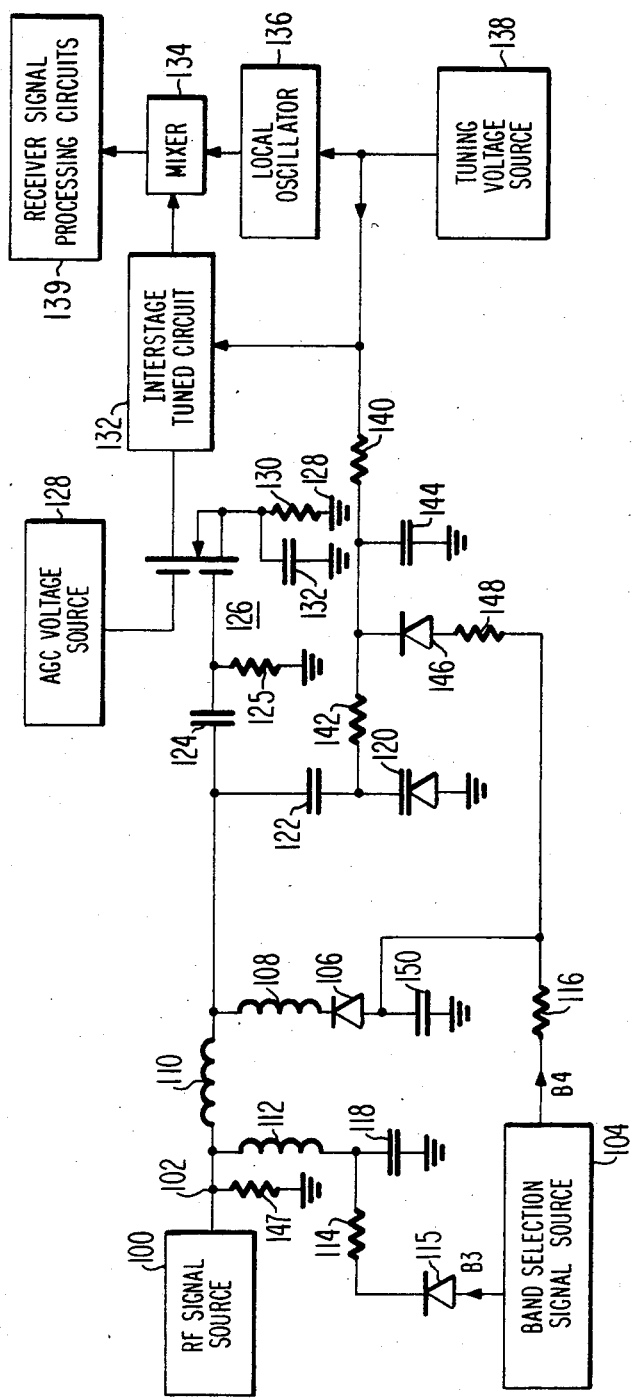

TUNING VOLTAGE TRACKING ARRANGEMENT

The present invention relates to the field of tuning voltage tracking arrangements and more particularly to arrangements for providing tracking between radio frequency (RF) and local oscillator (LO) tuning stages in a superheterodyne receiver, such as a typical television receiver.

In a superheterodyne receiver, the frequency difference between the LO frequency and the frequency to which RF stages are tuned should remain constant and equal to the intermediate frequency (IF) as the tuning is varied. Special techniques have been used in radio receivers for maintaining this difference constant so as to permit the use of a common tuning control for both the RF and LO tuning circuits. For example, satisfactory tracking may be achieved in typical receivers by coupling a "padder" capacitor in series with the tuning inductance in the RF or LO tuning stages and by using trimmers. In receivers having more than one frequency band, it is economically desirable to use the same padder for more than one band, even though this may require a compromise away from the values required for proper tracking in different bands. However, when the difference in the frequency ranges between different bands is too great, it may no longer be possible to provide acceptable tracking over more than one band with a compromise padder value. For example, in the case of a television tuner stage for a frequency band covering 159–267 MHz and also a frequency band covering 273–465 MHz, a compromise value to permit the use of the same padder on both bands does not provide satisfactory tracking when a single tuning voltage controlled varactor tuning diode is used in each of the RF and LO circuits.

In accordance with an aspect of the invention, a superheterodyne receiver having a plurality of selectable tuning bands includes a tuning voltage source and a band selection signal source. A selectively enabled voltage modifying arrangement is coupled to the tuning voltage source and is responsive to the band selection signal for providing a modified tuning voltage to the RF tuning circuit when the tuning voltage is within a predetermined portion, less than the whole, of the tuning voltage range.

In accordance with another aspect of the invention, the voltage modifying arrangement comprises a resistance having a first end coupled to the tuning voltage source and a second end coupled to the afore-mentioned one of the RF and LO tuning circuits. The voltage modifying arrangement further comprises a diode arrangement coupled between the band selection signal source and the second end of the resistance.

In accordance with a further aspect of the invention, the second end of the resistance is coupled to the RF tuning circuit.

The sole FIGURE shows partly in block form and partly in circuit diagram form a schematic of a tuning voltage tracking arrangement constructed in accordance with the present invention.

In the tuning arrangement shown in the FIGURE, 100 is an RF signal source such as an antenna, cable television outlet, or a video tape recorder and is coupled to a television receiver input point 102. In order to make the description of the illustrated embodiment of the present invention more clear, circuit details not relevant to the explanation have been omitted or represented in block form. In addition, the tuning arrangement will be explained, by way of example, with reference to the third and fourth upper frequency bands (Band 3 between 159 and 267 MHz and Band 4 between 273 and 465 MHz) of the VHF frequency range although it is also applicable to other bands.

When Band 3 is selected, signal B3 supplied by a band selection signal source 104 will be at a relatively high positive voltage such as 12.5 volts, for example, and signal B4 will be substantially at 0 volts. This causes a switching PIN diode 106 to be reversed biased and substantially nonconductive. The series connection of inductances 110 and 112 forms a parallel resonant circuit with a varactor tuning capacitance diode 120 by way of capacitors 118 and 122. Capacitor 122 is the padder and also blocks DC. Capacitor 118 is a DC blocking capacitor and has no appreciable effect on the resonant circuit. A signal appearing across this resonant circuit is coupled by way of a capacitor 124 to a first gate electrode of field effect transistor (FET) 126 whose second gate is controlled by an AGC voltage source 128. The source electrode of FET 126 is coupled to a common ground 128 by way of a biasing resistor 130 and a bypass capacitor 132 for providing bias. The drain electrode of FET 126 is coupled to an interstage tuned circuit 132 whose output is applied to a mixer 134 for heterodyning with the signal supplied by a voltage controlled local oscillator (LO) 136. The output from mixer 134 is supplied to receiver signal processing circuits 139 for further processing.

A tuning voltage source 138 provides tuning voltage to local oscillator 136, interstage tuned circuit 132 and to varactor diode 120. The tuning voltage is supplied to varactor diode 120 by way of series connected resistors 140 and 142, the junction point of the resistors being bypassed by a capacitor 144. This junction is also coupled to the cathode of a diode 146 whose anode is coupled by way of a resistor 148 to the junction point of resistor 116 and diode 106 anode. As explained, signal B4 is substantially at 0 volts when Band 3 is selected and consequently, diode 146 is reversed biased for Band 3 since its cathode is coupled to the tuning voltage which is always positive relative to ground. When Band 4 is selected, signal B4 is positive, for example, 14 volts. Signal B4 causes diode 106, which was non-conductive for Band 3 to become conductive with its cathode current flowing to ground by way of a resistor 147. Inductance 108 is thereby effectively coupled to ground by way of diode 106 and a bypass capacitance 150 which effectively couples it in parallel with the series combination of inductances 110 and 112. This parallel combination of inductances represents a smaller effective inductance than the series combination of inductances 110 and 112 alone and therefore forms a resonant circuit with varactor diode 12 having a higher resonant frequency, as is required for Band 4. Furthermore, since signal B4 is positive for Band 4, diode 146 is forward biased when the tuning voltage is less positive than the voltage applied to the anode of diode 146 in response to signal B4.

As has been mentioned, a compromise to permit the use of the same padder value on both Bands 3 and 4 does not provide acceptable tracking with a single varactor diode in each of the RF and LO circuits. Instead of attempting such a compromise, the present inventors have found it advantageous, as a first step, to select the value of padder capacitor 122 to provide good tracking on Band 3, without taking into consideration the value required for Band 4. However, if this is done without resort to the present invention, and Band 4 is selected, the RF tuning extends too far at the low frequency end of the tuning range, which makes tracking impracticable. The low frequency end of the tuning range occurs when the tuning voltage has its least positive value, which causes varactor diode 120 to exhibit its greatest capacitance. In accordance with the present invention, diode 146 begins conducting when the tuning voltage has fallen to a level corresponding to a tuning point where the RF tuning frequency tends to deviate from the value it should have for proper tracking. Conduction in diode 146 due to the positive B4 signal on its anode modifies the tuning voltage applied to varactor diode 120, making it more positive than in the absence of such conduction, thus making the varactor diode tuning capacitance smaller than in the absence of such conduction. The tuning variation caused by the tuning voltage supplied by tuning voltage source 138 is thereby modified in a direction to provide correct tracking on Band 4 with the same padder value selected for correct tracking on Band 3. The amount by which the tuning voltage is modified depends on the tuning voltage level and corresponds to the modificaion needed for acceptable tracking. Proper tracking is achieved in this manner for both Band 3 and Band 4 without the need to compromise performance in either band because of the padder requirement of the other band.

The implementation of the invention in accordance with the described embodiment is illustrative. While the operation of the invention has been described with reference to television Bands 3 and 4, it will be understood that the invention is clearly adaptable to other frequencies and other types of receivers. The polarities selected for supply and signal voltages and diode poling are clearly matters of particular design and may be changed to suit various requirements without departing from the scope of the invention.

What is claimed is:

1. In a superheterodyne radio frequency (RF) receiver having a plurality of selectable tuning bands and including a tuning voltage source for providing a tuning voltage variable over a predetermined voltage range for selecting channels in said tuning bands, voltage controlled RF means for selecting an RF signal from a plurality of received RF signals corresponding to respective ones of said channels in response to an RF tuning voltage, local oscillator (LO) means for generating a LO signal having a plurality of frequencies corresponding to respective ones of said channels in response to an LO tuning voltage, mixer means for mixing said selected RF signal and said LO signal to produce an IF signal, tuning circuit means associated with said RF means for tuning said RF means in said tuning bands in response to said RF tuning voltage, and a selection signal source for providing a selection signal voltage to said tuning circuit means for selectively causing said RF means to be tuned in one of said tuning bands, a tuning voltage tracking arrangement comprising:

coupling means for coupling said tuning voltage to an RF tuning voltage input as said RF tuning voltage and to an LO tuning voltage input as said LO tuning voltage;

selectively enabled voltage modifying means coupled to said tuning voltage source and being responsive to said selection signal voltage for selectively modifying said RF tuning voltage relative to said LO tuning voltage and for providing said modified RF tuning voltage in said one band only when said tuning voltage provided by said tuning voltage source is within a predetermined portion, less than the whole, of said predetermined range so that said RF signal selected by said RF means and the frequency of said local oscillator produced by said local oscillator means track one another to correspond to the same channel for each one of said channels selected throughout said bands.

2. The tracking arrangement as recited in claim 1 wherein said voltage modifying means comprises resistor means having a first end coupled to said RF tuning voltage input and a second end coupled to said tuning circuit means and further comprising diode means coupled between said selection signal source and said second end of said resistor means.

3. The tracking arrangement recited in claim 1 wherein said tuning circuit means comprises varactor tuning diode means.

4. The tracking arrangement recited in claim 3 wherein said tuning circuit means comprises a padder.

5. The tracking arrangement recited in claim 4 wherein a potential difference between said selection signal voltage and said tuning voltage causes said diode means to conduct when said tuning voltage provided by said tuning voltage source is within said predetermined portion of said predetermined range and said selection signal selects said one of said bands.

6. The tracking arrangement recited in claim 5 wherein said predetermined portion of said predetermined range includes the end of said predetermined range corresponding to the lower tuning frequency in said one of said bands.

* * * * *

UNITED STATES PATENT AND TRADEMARK OFFICE
CERTIFICATE OF CORRECTION

PATENT NO. : 4,658,437

DATED : April 14, 1987

INVENTOR(S) : Nathaniel Haluk Ersoz et al.

It is certified that error appears in the above-identified patent and that said Letters Patent is hereby corrected as shown below:

Column 4, Claim 6, line 49, "lower" should be -- lowest --.

Signed and Sealed this

Seventh Day of February, 1989

Attest:

DONALD J. QUIGG

Attesting Officer

Commissioner of Patents and Trademarks